(12) United States Patent
Chen et al.

(10) Patent No.: US 7,009,540 B1
(45) Date of Patent: Mar. 7, 2006

(54) METHOD FOR DESIGNING A NOISE SHAPER WITH A SINGLE LOOP DISTRIBUTED FEEDBACK DELTA-SIGMA MODULATOR

(75) Inventors: Juinn-Yan Chen, Fremont, CA (US); Wei-Gian Chen, Taipei (TW); Zuoqin Wang, Cupertino, CA (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/905,425

(22) Filed: Jan. 4, 2005

(51) Int. Cl.
*H03M 3/00* (2006.01)

(52) U.S. Cl. ...................................... 341/143; 341/155
(58) Field of Classification Search ................ 341/143, 341/144, 155, 157
See application file for complete search history.

(56) References Cited

U.S. PATENT DOCUMENTS

| | | | |
|---|---|---|---|
| 5,150,120 A * | 9/1992 | Yunus ........................ | 341/143 |
| 6,101,864 A * | 8/2000 | Abrams et al. ............... | 73/1.01 |
| 6,169,507 B1 * | 1/2001 | Bianchessi et al. ......... | 341/143 |
| 6,819,275 B1 * | 11/2004 | Reefman et al. ............ | 341/143 |
| 2005/0052300 A1 * | 3/2005 | Ranganathan ............... | 341/143 |

\* cited by examiner

*Primary Examiner*—Peguy Jeanpierre
*Assistant Examiner*—Joseph Lauture
(74) *Attorney, Agent, or Firm*—Winston Hsu

(57) ABSTRACT

A method for designing a noise shaper with a single loop distributed feedback delta-sigma modulator includes following steps: (a) determining a delta-sigma modulator comprising a plurality of parameters according to an order of the noise shaper; (b) deriving a noise transfer function comprising a plurality of coefficients corresponding to the parameters of the delta-sigma modulator according to the delta-sigma modulator; (c) determining a high-pass filter corresponding to the delta-sigma modulator according to a default requirement; (d) solving the coefficients of the noise transfer function according to the high-pass filter; and (e) feeding the solved coefficients in step (d) into the parameters of the delta-sigma modulator for completing the noise shaper.

4 Claims, 9 Drawing Sheets

METHOD FOR DESIGNING A NOISE SHAPER WITH A SINGLE LOOP DISTRIBUTED FEEDBACK DELTA-SIGMA MODULATOR

BACKGROUND OF INVENTION

1. Field of the Invention

The present invention provides a method for designing a noise shaper, and more particularly, a method for designing a noise shaper with a single loop distributed feedback delta-sigma modulator.

2. Description of the Prior Art

Delta-sigma modulators have been widely used for A/D converters and D/A converters owing to its ability of noise shaping, which can suppress quantizing noise within a signal bandwidth, and increase a signal to noise ratio, or SNR.

Please refer to FIG. 1 and FIG. 2. FIG. 1 illustrates a basic configuration diagram of a prior art delta-sigma modulator 10, while FIG. 2 illustrates a related-signal diagram of the delta-sigma modulator 10 when shaping quantizing noise. In FIG. 1, the prior art delta-sigma modulator 10 includes an integrator 12, a quantizer 14, and a differentiator 16, where the integrator 12 and the differentiator 16 are complement. Referring to FIG. 2, after the delta-sigma modulator 10 receives a signal, the integrator 12 enhances a low-frequency component of the signal. Then, the quantizer 14 quantizes the signal and adds a quantizing noise $e_{q1}(z)$ generated by quantizing errors. Finally, the signal is returned with the differentiator 16, and the quantizing noise within the signal bandwidth is suppressed.

As to implementations of the delta-sigma modulator 10, please refer to FIG. 3 and FIG. 4. FIG. 3 illustrates a schematic diagram of a first-order delta-sigma modulator 20, while FIG. 4 illustrates a schematic diagram of an improved first-order delta-sigma modulator 30 in comparison with the delta-sigma modulator 20. Similar to the delta-sigma modulator 10, the first-order delta-sigma modulator 20 includes an integrator 22, a quantizer 24, and a differentiator 26, where the integrator 22 and the differentiator 26 are first-order and complement. Since a large direct-current gain of the integrator 22 causes output signals overflowing, under the condition that a transfer function of the delta-sigma modulator 20 will not be changed, a subtraction part of the differentiator 26 of the delta-sigma modulator 20 in FIG. 3 is moved to the front, or the input, of the integrator 22 by means of a negative feedback method, so as to form the delta-sigma modulator 30 and improve the overflow problem.

Because the noise-shaping performance of the first-order delta-sigma modulator is degraded when transforming into a phase domain, a higher-order delta-sigma modulator is necessary for suppressing low-frequency quantizing noise. As the order of the delta-sigma modulator increases, phase noise is pushed to higher frequency. However, a high-order delta-sigma modulator is very complicated. For example, please refer to FIG. 5, which illustrates a schematic diagram of a prior art third-order delta-sigma modulator 50. The delta-sigma modulator 50 includes integrators 52, 54, 56, a quantizer 58, and a differentiator. Referring to FIG. 4 and FIG. 5, for implementing the delta-sigma modulator 50, two first-order integrators are added to the delta-sigma modulator 40, and the subtraction part of the differentiator of the delta-sigma modulator 40 is moved to the input of the delta-sigma modulator 40. Nevertheless, a first-order integrator has a 90° phase shift, so a string of three first-order integrators have a 270° phase shift, causing an unstable condition. Therefore, how to determine parameters $a_1$, $a_2$, and $a_3$ of the third-order delta-sigma modulator 50 is of importance.

In the prior art, the parameters are determined by means of a try-and-error method or a successive approximation method, which wastes time and may mistake. Moreover, as the order of the delta-sigma modulator increases, the parameters of the delta-sigma modulator become more difficult to be analyzed.

SUMMARY OF INVENTION

It is therefore a primary objective of the claimed invention to provide a method for designing a noise shaper with a single loop distributed feedback delta-sigma modulator.

According to the claimed invention, a method for designing a noise shaper with a single loop distributed feedback delta-sigma modulator includes: (a) determining a delta-sigma modulator comprising a plurality of parameters according to an order of the noise shaper; (b) deriving a noise transfer function comprising a plurality of coefficients corresponding to the parameters of the delta-sigma modulator according to the delta-sigma modulator; (c) determining a high-pass filter corresponding to the delta-sigma modulator according to a default requirement; (d) solving the coefficients of the noise transfer function according to the high-pass filter; and (e) feeding the solved coefficients in step (d) into the parameters of the delta-sigma modulator for completing the noise shaper.

The present invention further discloses a method for determining parameters of a single loop distributed feedback delta-sigma modulator. The method includes: (a) deriving a noise transfer function of the delta-sigma modulator according to the delta-sigma modulator; (b) determining a filter corresponding to the delta-sigma modulator according to a default requirement; and (c) corresponding to filter to the delta-sigma modulator for determining the parameters of the delta-sigma modulator.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
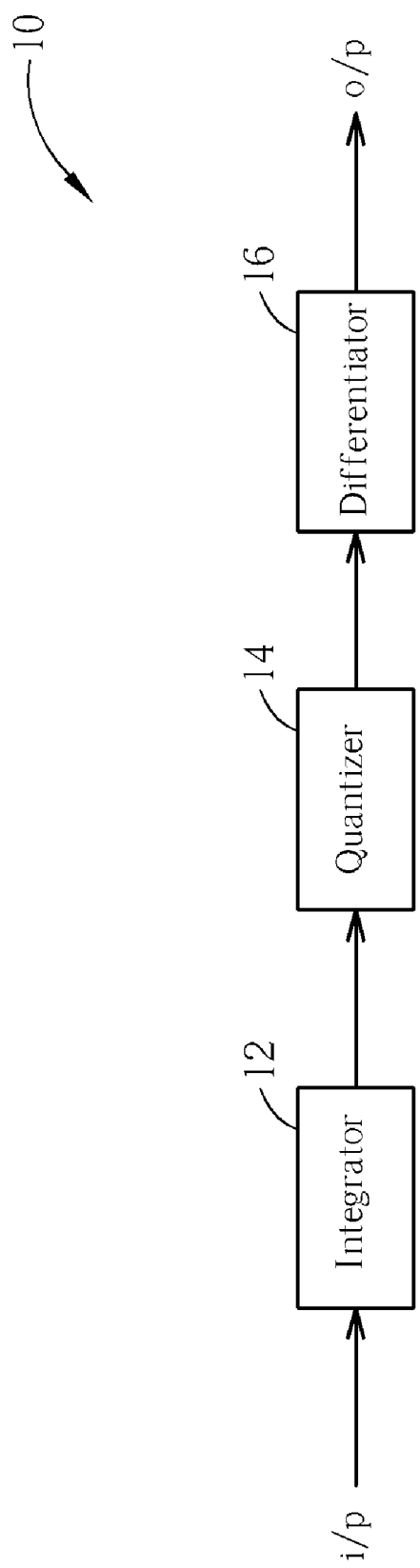
FIG. 1 illustrates a schematic of a prior art delta-sigma modulator.
Figure 2:
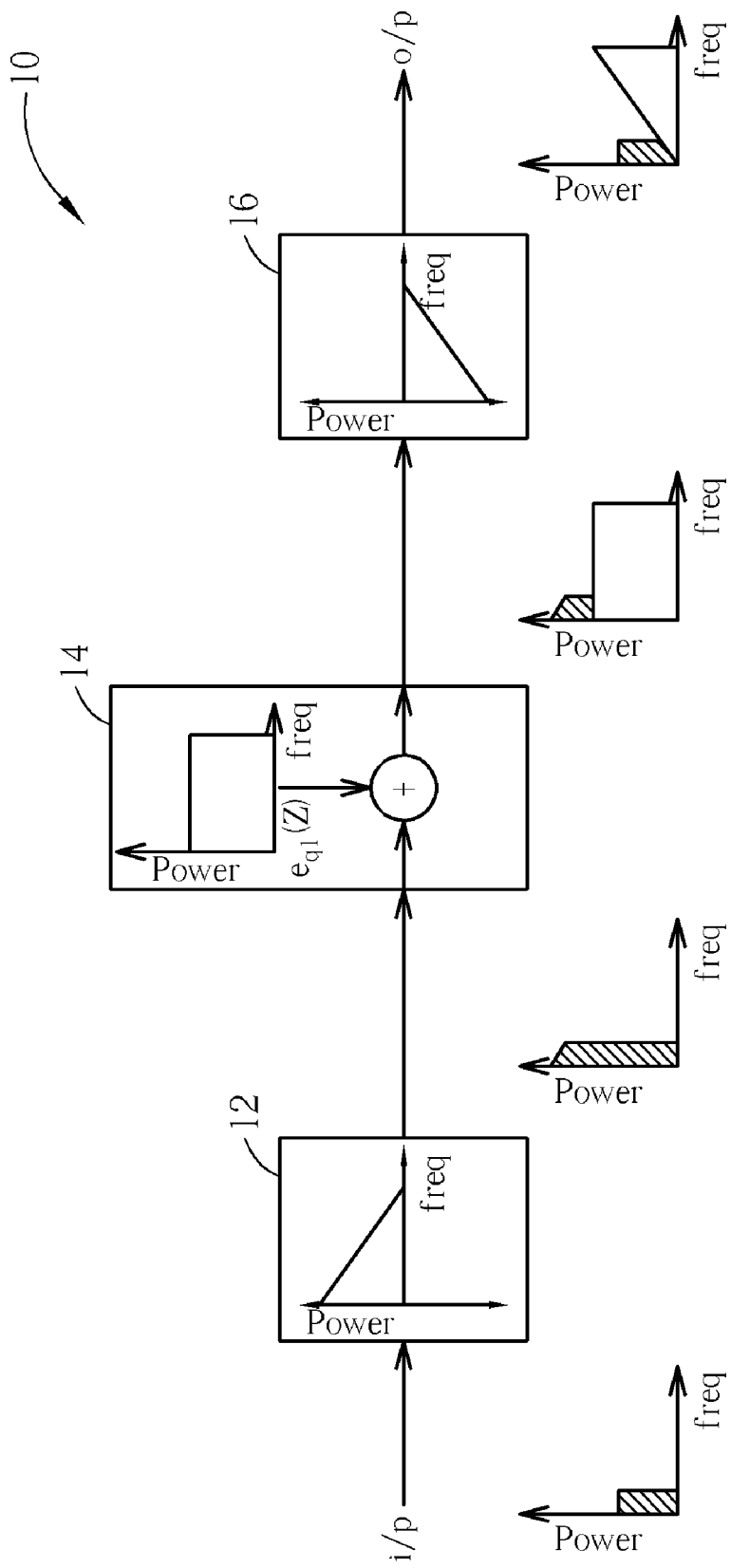
FIG. 2 illustrates a related signal diagram of the delta-sigma modulator in FIG. 1 when shaping quantizing noise.
Figure 3:
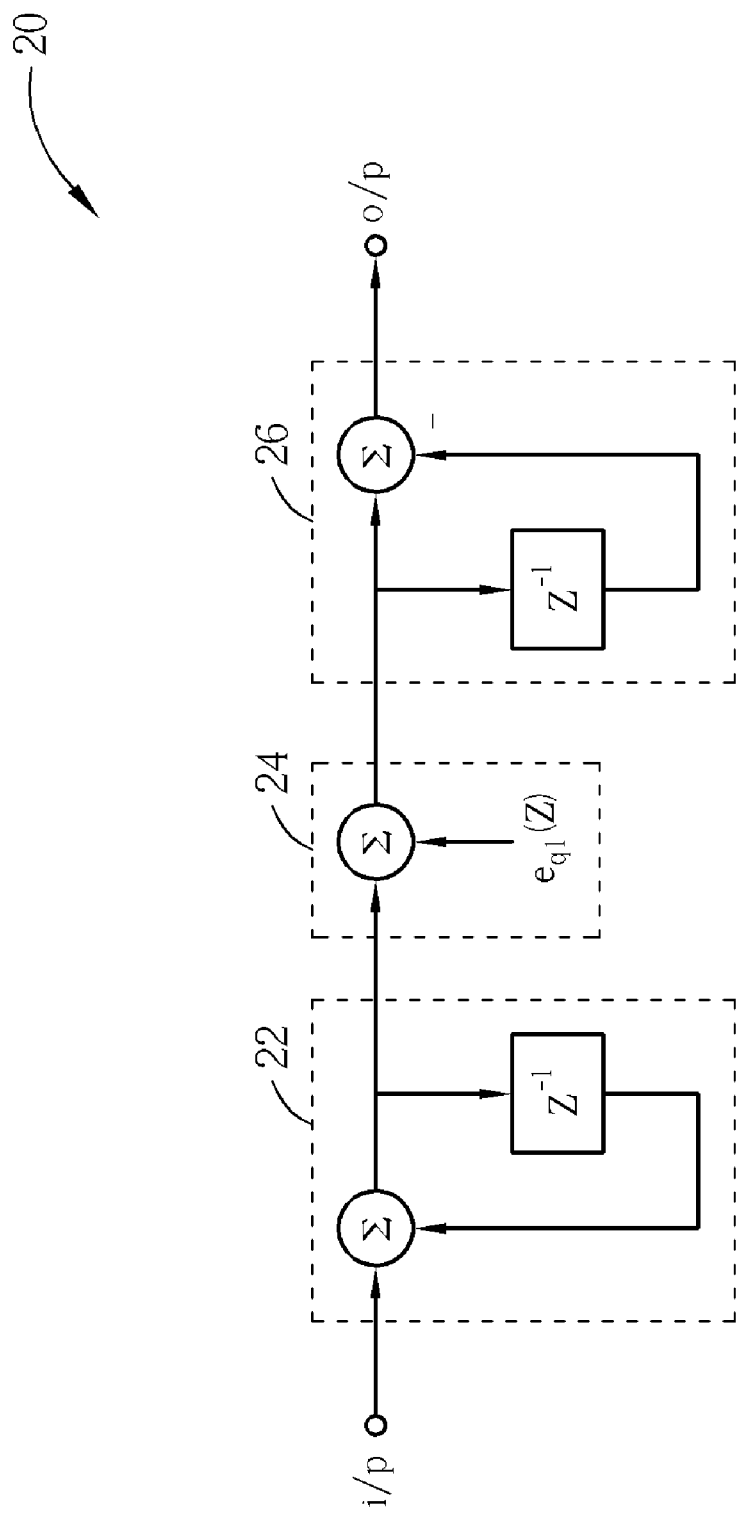
FIG. 3 illustrates a schematic diagram of a prior art first-order delta-sigma modulator.
Figure 4:
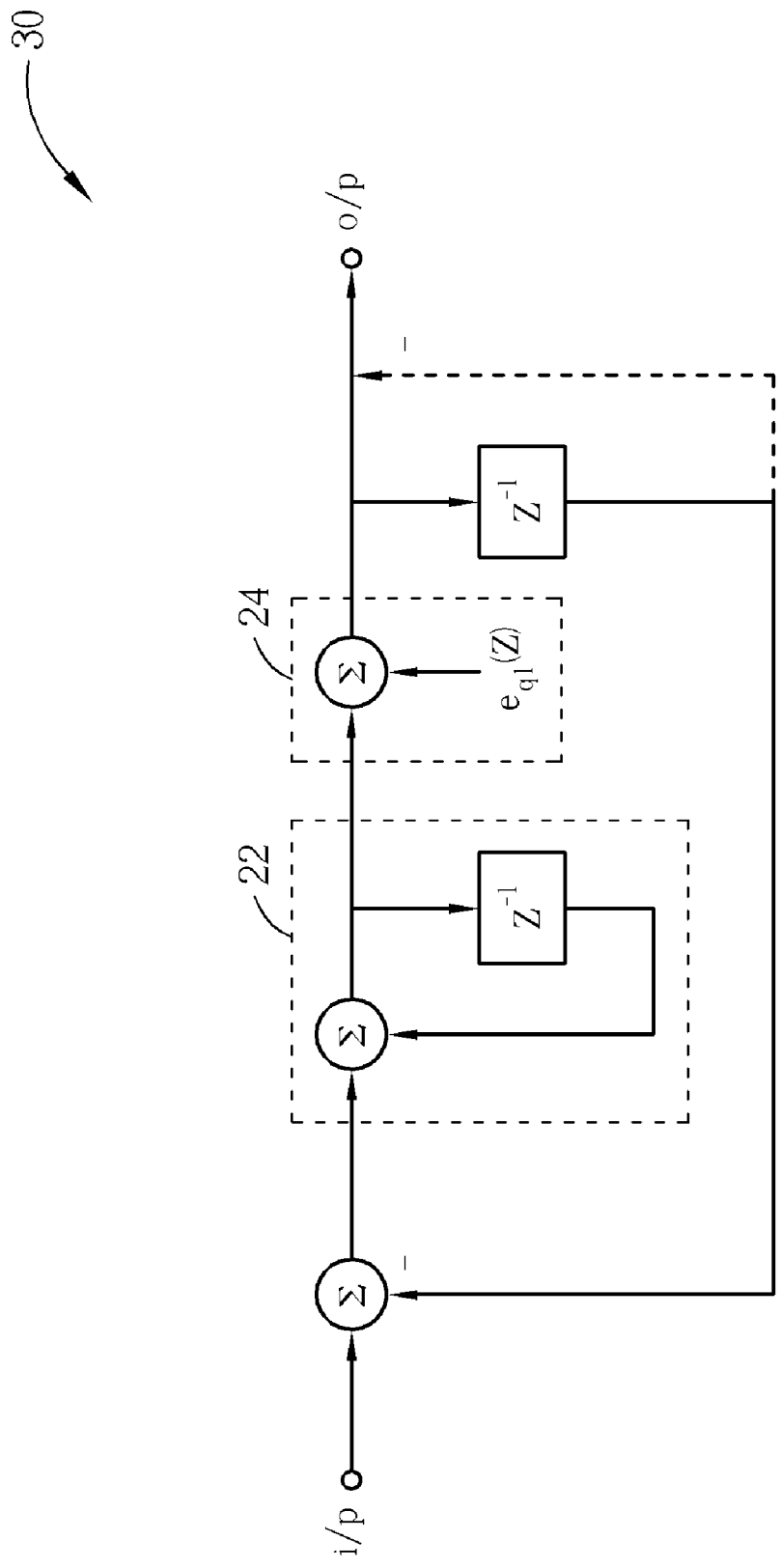
FIG. 4 illustrates a schematic diagram of an improved first-order delta-sigma modulator.
Figure 5:
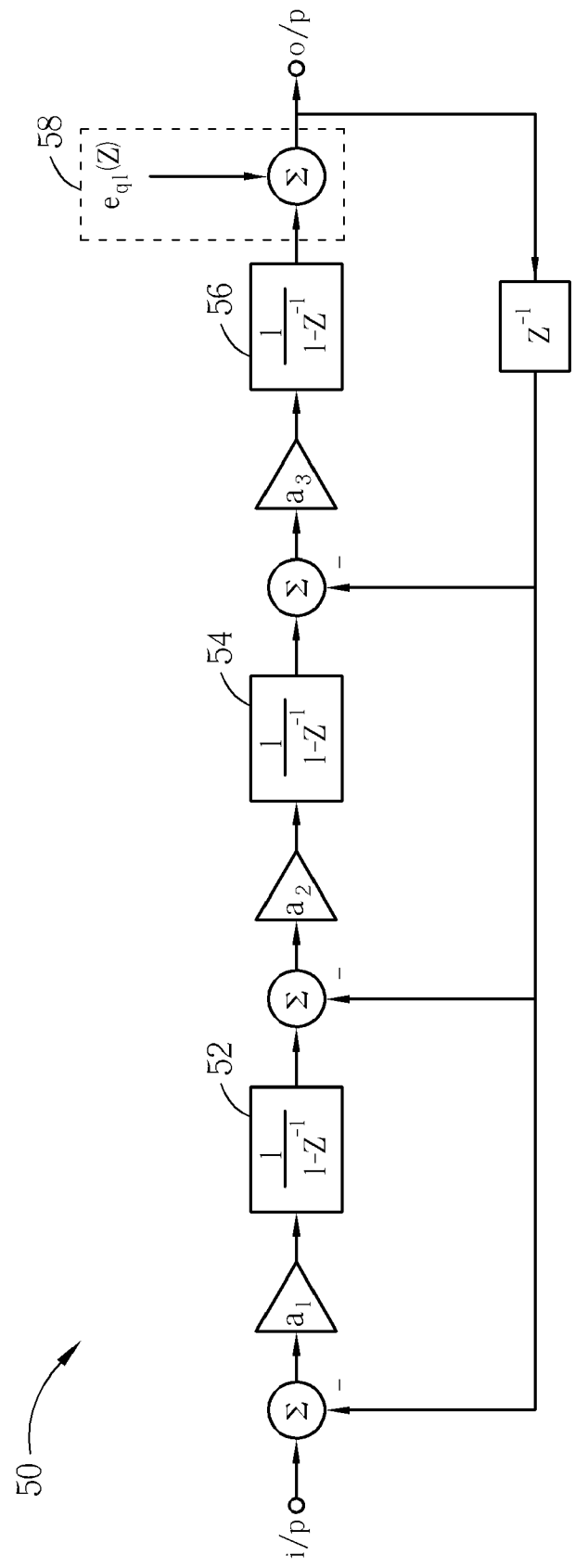
FIG. 5 illustrates a schematic diagram of a prior art third-order delta-sigma modulator.
Figure 6:
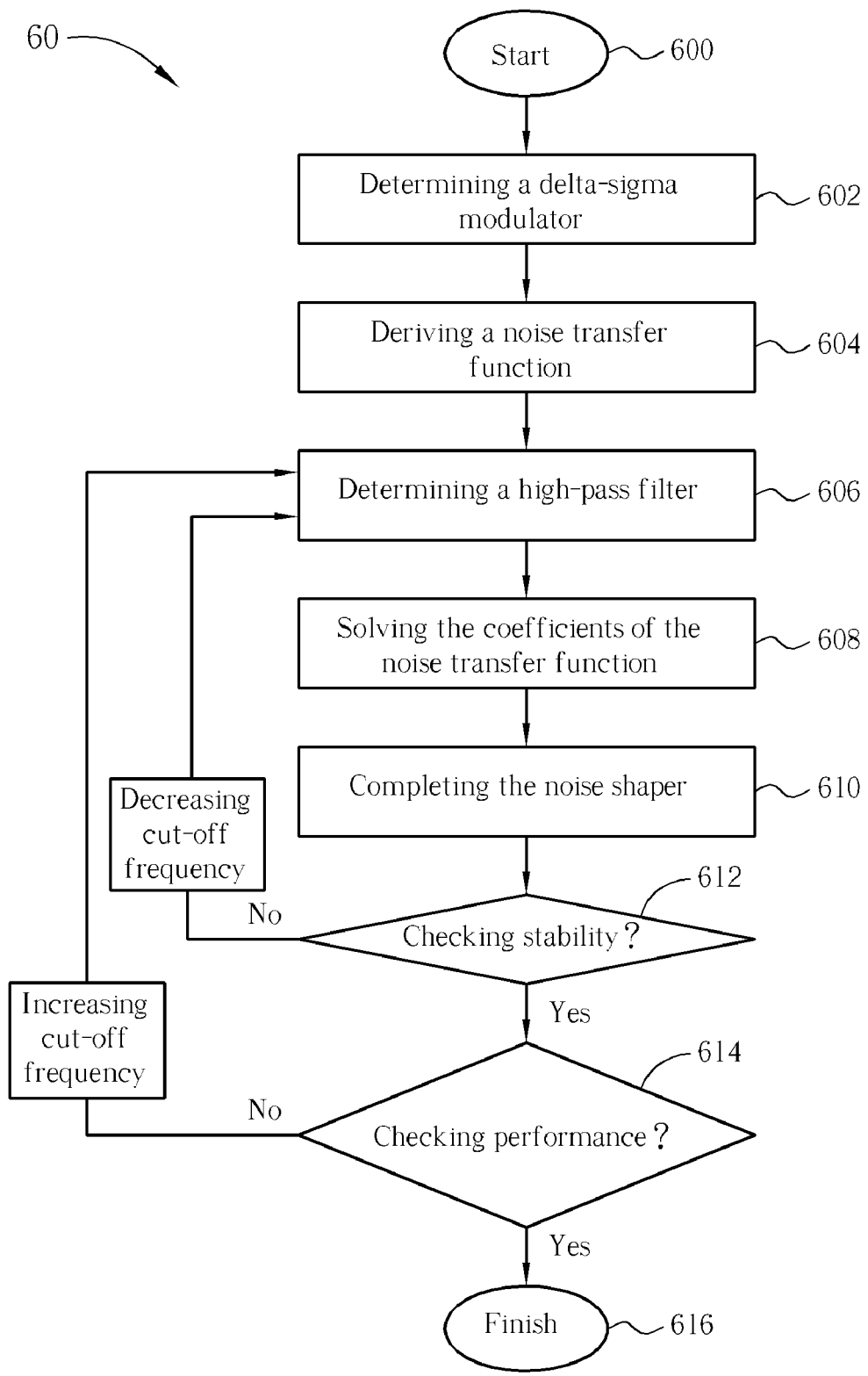
FIG. 6 illustrates a flowchart of a design process of a noise shaper in accordance with the present invention.

Please refer to FIG. 6, which illustrates a flowchart of a design process 60 of a noise shaper in accordance with the present invention. The process 60 can complete the noise shaper with a delta-sigma modulator, and includes following steps:

Step 600: start.

Step 602: determining a delta-sigma modulator. According to a predetermined order of the noise shaper, determining the delta-sigma modulator including a plurality of parameters.

Step 604: deriving a noise transfer function. According to the determined delta-sigma modulator in step 602, deriving the noise transfer function of the delta-sigma modulator, where the noise transfer function includes a plurality of coefficients corresponding to the parameters of the delta-sigma modulator.

Step 606: determining a high-pass filter. According to a default requirement, determining the high-pass filter corresponding to the delta-sigma modulator.

Step 608: solving the coefficients of the noise transfer function. According to the high-pass filter, solving the coefficients.

Step 610: completing the noise shaper. Feeding the solved coefficients in step 608 to the parameters of the delta-sigma modulator for completing the noise shaper.

Step 612: checking stability. Determining whether the delta-sigma modulator in step 610 is stable or not, and going back to step 606 and decreasing a cut-off frequency of the high-pass filter if the delta-sigma modulator is not stable.

Step 614: checking performance. Determining whether the performance of the delta-sigma modulator in step 610 is acceptable or not, and going back to step 606 and increasing the cut-off frequency of the high-pass filter if the delta-sigma modulator is not acceptable.

Step 616: finish.

In a delta-sigma modulator, a relationship between output and input signals can be defined as a signal transfer function STF, while a relationship between output and input quantizing noises can be defined as a noise transfer function NTF. Since the input signal of the delta-sigma modulator passes through the integrator, the quantizer, and the differentiator before entering a system. That is, the signal transfer function STF of the delta-sigma modulator should be 1 ideally. On the other hand, the input quantizing noise only passes through the quantizer and the differentiator before entering the system, and since the differentiator performs like a high-pass filter, the noise transfer function NTF of the delta-sigma modulator should be an impulse response of the high-pass filter, or $(1-Z^{-1})^m$, where m is the order of the high-pass filter. Therefore, when designing a noise shaper with m order, the present invention 60 determines a delta-sigma modulator including m parameters, and derives a noise transfer function of the delta-sigma modulator. Then, the process 60 determines a high-pass filter conforming to the delta-sigma modulator with a filter designing software, such as Matlab. According to the high-pass filter, the process 60 figures out coefficients of the noise transfer function, and feeds the coefficients into the parameters of the delta-sigma modulator to complete the delta-sigma modulator. Finally, the process 60 checks stability and performance of the delta-sigma modulator. In short, since the noise transfer function NTF of the delta-sigma modulator corresponds to a high-pass transfer function, the present invention determines a high-pass filter corresponding to the delta-sigma modulator with the filter designing software, so as to figure out the optimal parameters of the delta-sigma modulator. Then, the present invention checks whether the designed delta-sigma modulator is stable or not. When the delta-sigma modulator is not stable, the present invention decreases the cut-off frequency of the high-pass filter, and re-calculates the parameters of the delta-sigma modulator. Meanwhile, the present invention further checks the performance, and increases the cut-off frequency of the high-pass filter and re-calculates the parameters of the delta-sigma modulator if the performance is not acceptable.

Figure 7:
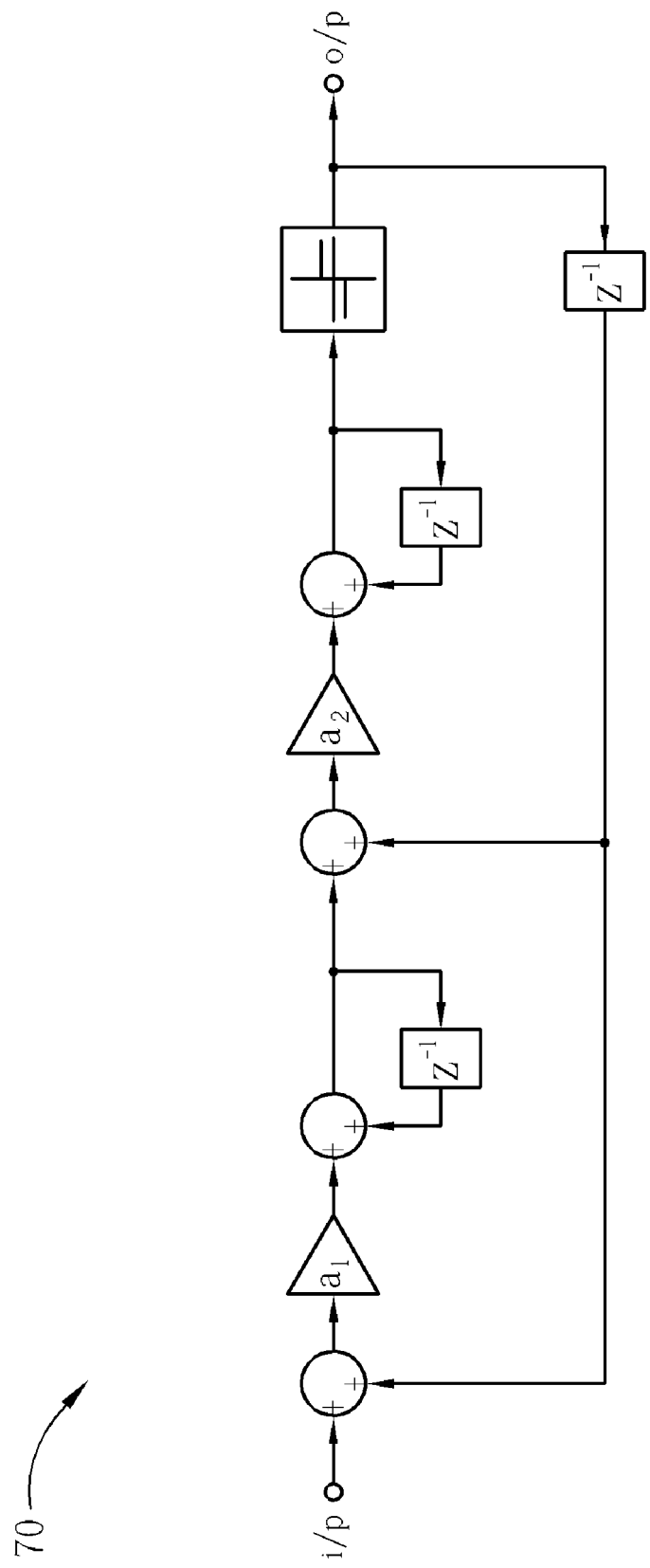
FIG. 7 illustrates a schematic diagram of a second-order delta-sigma modulator.
Figure 8:
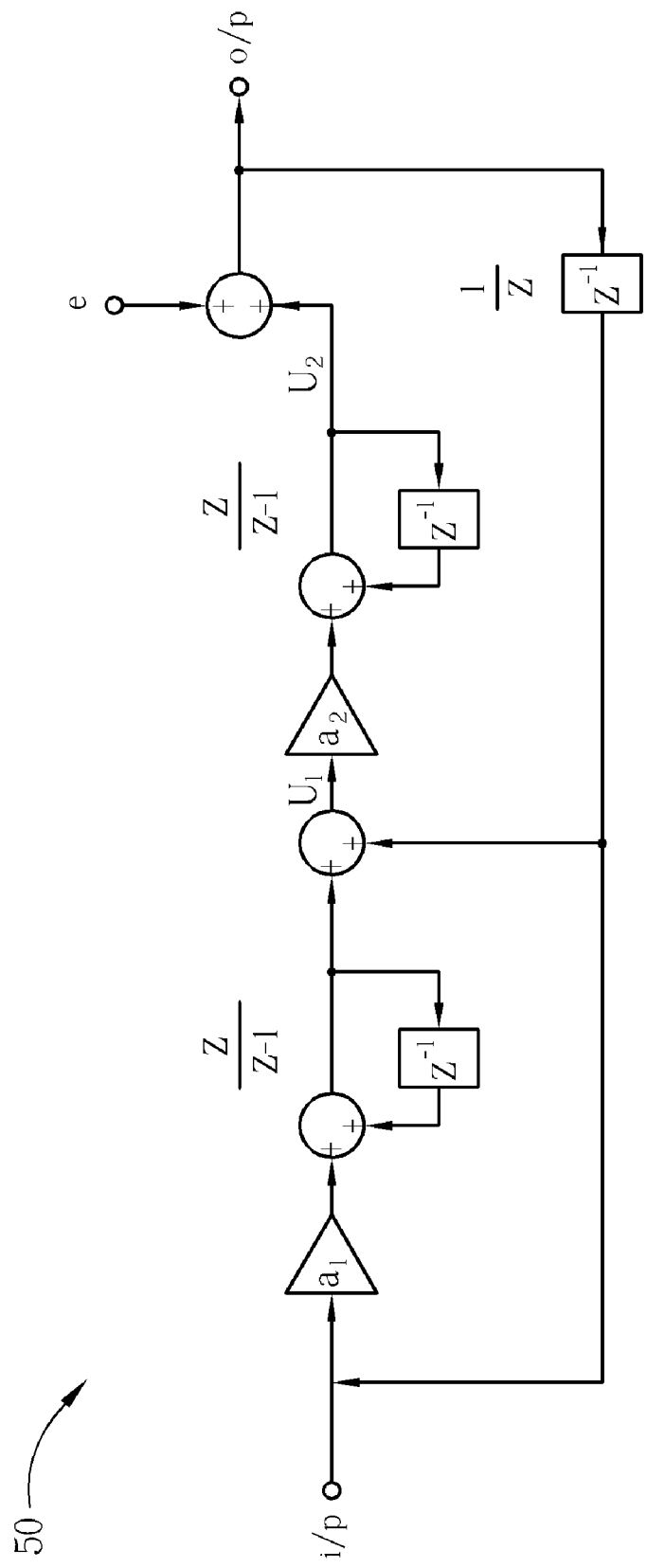
FIG. 8 labels related Z transfer functions of the delta-sigma modulator in FIG. 7.

For example, if a second-order delta-sigma modulator is needed, the present invention process 60 determines a second-order delta-sigma modulator first. Please refer to FIG. 7, which illustrates a schematic diagram of a second-order delta-sigma modulator 70. The delta-sigma modulator 70 includes two parameters $a_1$ and $a_2$. In order to determine the parameters $a_1$ and $a_2$, the process 60 derives a noise transfer function. Please refer to FIG. 8, which labels related Z transfer functions of the delta-sigma modulator 70. In FIG. 8, if an output of the first integrator is $u_1$, an output of the second integrator is $u_2$, an input quantizing noise is e, and an output quantizing noise is y, equations can be gained as follows:

$$y = e + u_2 \qquad \text{Eq. 1}$$

$$u_1 = y \cdot \frac{1}{z} \cdot a_1 \cdot \frac{z}{z-1} + y \cdot \frac{1}{z} \qquad \text{Eq. 2}$$

$$u_2 = u_1 \cdot a_2 \cdot \frac{z}{z-1} \qquad \text{Eq. 3}$$

Substitute Eq. 2 for Eq. 3, and substitute Eq. 3 for Eq. 1, then $$y = e + \left( y \cdot \frac{1}{z} \cdot a_1 \cdot \frac{z}{z-1} + y \cdot \frac{1}{z} \right) \cdot a_2 \cdot \frac{z}{z-1}$$

$$y \cdot \left( 1 - \frac{a_1 \cdot a_2 \cdot z}{(z-1)^2} - \frac{a_2}{z-1} \right) = e$$

$$\therefore NTF = \frac{y}{e} = \frac{1}{1 - \frac{a_1 \cdot a_2 \cdot z}{(z-1)^2} - \frac{a_2}{z-1}}$$

$$= \frac{(z-1)^2}{(z-1)^2 - a_1 \cdot a_2 \cdot z - a_2 \cdot (z-1)}$$

$$= \frac{(z-1)^2}{z^2 + (-2 - a_1 \cdot a_2 - a_2) \cdot z + (1 + a_2)}$$

If cut-off frequencies provided by Matlab are Den(2) and Den(3), then:

$$Den(2) = (-2a_1 \cdot a_2 - a_2)$$

$$Den(3) = (1 + a_2)$$

So, $$a_2 = Den(3) - 1$$

$$a_1 = -\frac{Den(2) + 2}{a_2} - 1$$

Figure 9:
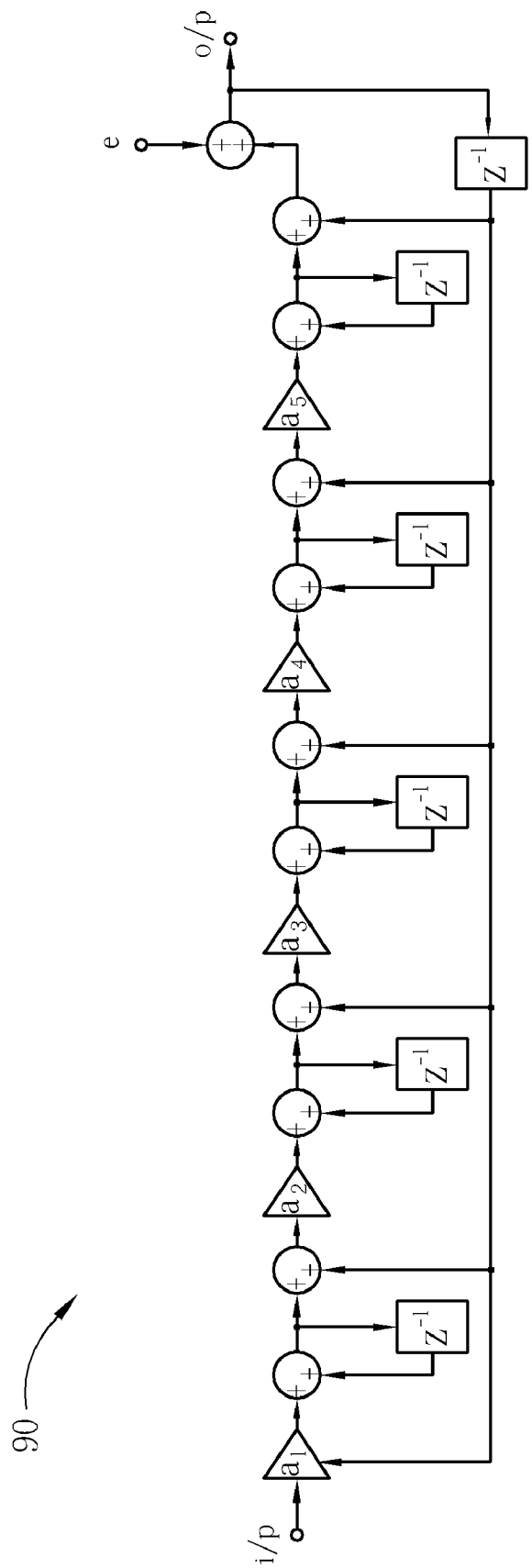
FIG. 9 illustrates a schematic diagram of a fifth-order delta-sigma modulator.

By the same token, the present invention process 60 can also complete a high-order noise shaper with high efficiency. Please refer to FIG. 9, which illustrates a schematic diagram of a fifth-order delta-sigma modulator 90. The delta-sigma modulator 90 includes five parameters $a_1$, $a_2$, $a_3$, $a_4$, and $a_5$. If cut-off frequencies are Den(2), Den(3), Den(4), Den(5), and Den(6), then according to the process 60, the parameters are as follows:

$$a_5 = -Den(6) - 1$$

$$a_4 = \frac{Den(5) - 5}{a_5} - 4$$

$$a_3 = -\frac{Den(4) + 10 + 6 \cdot a_5}{a_4 \cdot a_5} - 3$$

$$a_2 = \frac{Den(3) - 10 - 4 \cdot a_5 - 3 \cdot a_4 \cdot a_5}{a_3 \cdot a_4 \cdot a_5} - 2$$

$$a_1 = -\frac{Den(2) + 5 + a_5 + a_4 \cdot a_5 + a_3 \cdot a_4 \cdot a_5}{a_2 \cdot a_3 \cdot a_4 \cdot a_5} - 1$$

Therefore, the process 60 can determine the parameters with high efficiency. In comparison, the prior art methods, such as the try-and-error method and the successive approximation method, waste time and may mistake especially for the high-order delta-sigma modulator, while the present invention corresponds the noise transfer function NTF of the delta-sigma modulator to the high-pass transfer function, which simplifies the designing procedure, saves time, and increases reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for designing a noise shaper with a single loop distributed feedback delta-sigma modulator, the method comprising following steps:
    (a) providing a delta-sigma modulator comprising a plurality of parameters according to an order of the noise shaper;
    (b) deriving a noise transfer function comprising a plurality of coefficients corresponding to the parameters of the delta-sigma modulator;
    (c) determining a high-pass filter corresponding to the delta-sigma modulator;
    (d) determining the coefficients of the noise transfer function by utilizing the high-pass filter; and
    (e) feeding the determined coefficients in from step (d) into the parameters of the delta-sigma modulator for completing the noise shaper.

2. The method of claim 1, wherein in step (c), the high-pass filter is determined according to a predetermined filter type and a cut-off frequency.

3. The method of claim 1, wherein in step (c), the high-pass filter is determined with a filter designing software.

4. The method of claim 1 further comprising step (f) checking whether the determined delta-sigma modulator in step (e) is stable or not, and retuning to step (c) and decreasing the cut-off frequency of the high-pass filter when the delta-sigma modulator is not stable.

* * * * *